United States Patent
Spiegel et al.

(10) Patent No.: US 7,161,997 B2
(45) Date of Patent: Jan. 9, 2007

(54) PROGRAMMABLE BASEBAND MODULE

(75) Inventors: Solon J. Spiegel, Tel Aviv (IL); Ilan Barak, Kfar Saba (IL); Doron Rainish, Ramat Gan (IL)

(73) Assignee: Intel Corporation, Santa Clara, CA (US)

( * ) Notice: Subject to any disclaimer, the term of this patent is extended or adjusted under 35 U.S.C. 154(b) by 764 days.

(21) Appl. No.: 10/025,969

(22) Filed: Dec. 26, 2001

(65) Prior Publication Data

US 2002/0150174 A1 Oct. 17, 2002

Related U.S. Application Data

(60) Provisional application No. 60/257,289, filed on Dec. 26, 2000.

(51) Int. Cl.
*H04B 1/10* (2006.01)

(52) U.S. Cl. .................................... 375/350
(58) Field of Classification Search ............. 375/259, 375/260, 261, 229, 292, 329, 337, 350, 302, 375/143, 144, 147, 152, 316, 343, 345, 267, 375/232; 455/134
See application file for complete search history.

(56) References Cited

U.S. PATENT DOCUMENTS

| | | | | |
|---|---|---|---|---|
| 5,347,537 A * | 9/1994 | Mori et al. | .................. | 375/142 |
| 5,598,285 A | 1/1997 | Kondo et al. | .................. | 349/39 |
| 5,598,478 A * | 1/1997 | Tanaka et al. | ................. | 381/17 |
| 5,623,511 A * | 4/1997 | Bar-David et al. | .......... | 375/143 |
| 5,768,317 A * | 6/1998 | Fague et al. | ................. | 375/296 |
| 5,838,037 A | 11/1998 | Masutani et al. | ............ | 257/296 |
| 5,946,060 A | 8/1999 | Nishiki et al. | ................ | 349/48 |
| 5,990,987 A | 11/1999 | Tanaka | ........................ | 349/43 |
| 6,028,653 A | 2/2000 | Nishida | ........................ | 349/141 |
| 6,097,454 A | 8/2000 | Zhang et al. | .................. | 349/43 |
| 6,100,827 A * | 8/2000 | Boesch et al. | ............... | 341/118 |
| 6,151,487 A * | 11/2000 | Kim et al. | .................... | 455/134 |
| 6,169,767 B1 * | 1/2001 | Strolle et al. | ................ | 375/302 |
| 6,215,429 B1 * | 4/2001 | Fischer et al. | ............... | 341/139 |
| 6,256,485 B1 * | 7/2001 | Heard | ....................... | 455/161.1 |
| 6,282,184 B1 * | 8/2001 | Lehman et al. | .............. | 370/342 |
| 6,404,821 B1 * | 6/2002 | Dent | ........................... | 375/267 |
| 6,593,880 B1 * | 7/2003 | Velazquez et al. | ........... | 342/367 |

FOREIGN PATENT DOCUMENTS

| | | |
|---|---|---|
| JP | 09-005764 | 1/1997 |
| JP | 09-073101 | 3/1997 |
| JP | 09-101538 | 4/1997 |
| JP | 09-105908 | 4/1997 |

OTHER PUBLICATIONS

R. Kieler et al.; "In-Plane Switching of Nematic Liquid Crystals"; Japan Display '92; pp. 547-550.

(Continued)

*Primary Examiner*—Emmanuel Bayard
(74) *Attorney, Agent, or Firm*—Pearl Cohen Zedek Latzer, LLP

(57) ABSTRACT

Briefly, in accordance with one embodiment of the invention, a multi-mode receiver comprises a programmable baseband module to filter a modulated signal according to the characteristics of the receiving mode. The programmable baseband module may further comprise a programmable convolver capable of switching between the receiving modes of the multi-mode receiver by programming an impulse response of a filter to the programmable convolver.

21 Claims, 4 Drawing Sheets

OTHER PUBLICATIONS

M. Oh-e, et al.; "Principles and Characteristics of Electro-Optical Behaviour with In-Plane Switching Mode"; Asia Display '95; pp. 577-580.

M. Ohta et al.; "Development of Super-TFT-LCDs with In-Plane Switching Display Mode"; Asia Display '95; pp. 707-710.

S. Matsumoto et al.; Display Characteristics of In-Plane Switching (IPS) LCDs and a Wide-Viewing-Angle 14.5-in. OPS TFT-LCD; Euro Display '96; pp. 445-448.

H. Wakemoto et al.; "An Advanced In-Plane Switching Mode TFT-LCD"; SID 97 Digest; pp. 929-932.

S.H. Lee et al.; High-Transmittance, Wide-Viewing-Angle Nematic Liquid Crystal Display Controlled by Fringe-Field Switching; Asia Display '98; pp. 371-374.

J. Strange and S. Atkinson, "A Direct Conversion Transceiver for Multi-band GSM Application", IEEE RFIC Symposium Digest, pp. 25-28, Boston 2000.

J. Crols and M. S. J. Steyaert, "Low-IF Topologies for High-Performance Analog Front Ends of Fully Integrated Receivers", IEEE Trans. on Circuit and Systems, vol. 45, No. 3, pp. 269-282, Mar. 1998.

B.J. Minnis et al., "A Low-IF Polyphase Receiver for GSM Using Log-Domain Signal Processing", IEEE RFIC Symposium Digest, pp. 83-86, Boston 2000.

Y. Poberezhskiy and G. Poberezhskiy, "Sampling Technique Allowing Exclusion of Antialiasing Filter", Electronic Letters, vol. 36, No. 4, pp. 297-298, Jan. 17, 2000.

* cited by examiner

PROGRAMMABLE BASEBAND MODULE

CROSS-REFERENCE TO RELATED APPLICATIONS

The present application claims priority from U.S. provisional application Ser. No. 60/257,289, filed Dec. 26, 2000, which is hereby incorporated by reference in its entirety.

BACKGROUND

In modern wireless communication systems such as cellular communication systems, dual-mode radio receivers nay employ two baseband modules: a baseband module for a first receiving mode, and a baseband module for a second receiving mode. The baseband modules may include filters to filter a receiving signal. The filters may be adjusted according to characteristics of the received signal. Characteristics of the received signal may include for example, frequency, amplitude and phase. For example, a dual-mode radio receiver for Global System for Mobile communications (GSM) and Wideband Code Division Multiple Access (WCDMA) may employ two baseband modules, one for GSM and one for WCDMA, respectively. Furthermore, the dual-mode radio receiver may include a switching system to switch between GSM and WCDMA baseband modules according to the characteristics of the received signal. Switching between receiving modes may generate interference to the received signal.

Thus, there is a continuing need for a baseband module to provide better ways to switch between receiving modes of multi-mode receivers.

BRIEF DESCRIPTION OF THE DRAWINGS

The subject matter regarded as the invention is particularly pointed out and distinctly claimed in the concluding portion of the specification. The inventions however, both as to organization and method of operation, together with objects, features, and advantages thereof, may best be understood by reference to the following detailed description when read with the accompanying drawings in which:

Figure 1:
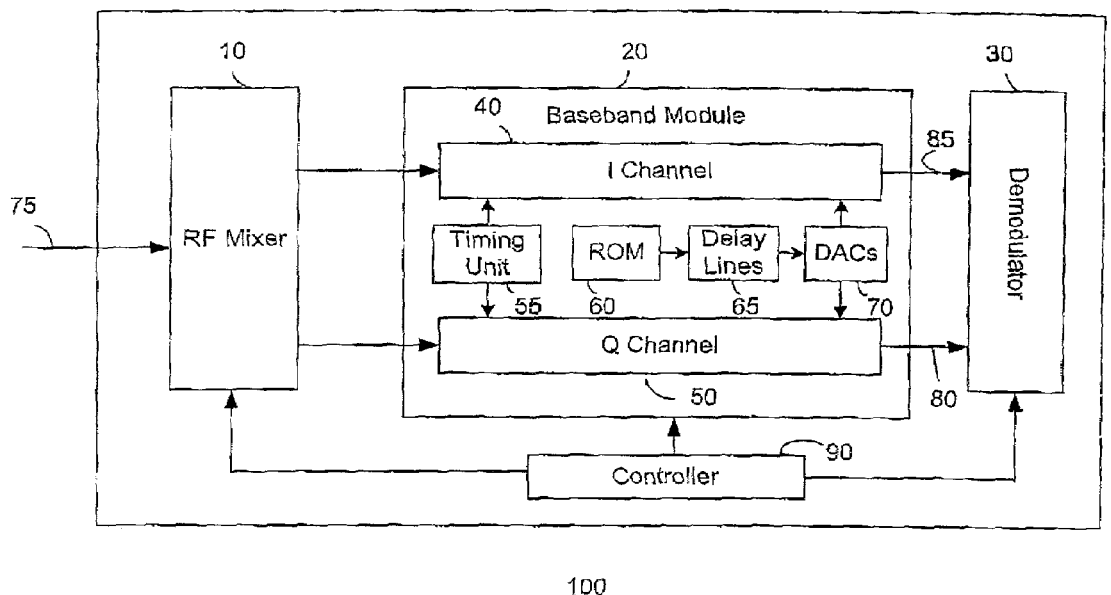
FIG. 1 is a block diagram of a multi-mode receiver in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

It should be understood that the present invention may used in variety of applications. Although the present invention is not limited in this respect, the circuits and techniques disclosed herein may be used in many apparatuses such as receivers of a radio system. Receivers intended to be included within the scope of the present invention include, by a way of example only, cellular radiotelephone receivers, two-way radio receivers, digital system receivers, analog system receivers and the like.

Type of cellular radiotelephone transmitters intended to be within the scope of the present invention include, although are not limited to, multi-mode radiotelephone receivers which may receive at least in part, signals of Code Division Multiple Access (CDMA), CDMA 2000, wide band CDMA (WCDMA), Global System for Mobile communication (GSM), Personal digital communication (PDC), Time Division Multiple Access (TDMA) receivers, Extended-TDMA (E-TDMA) cellular radiotelephone receivers and the like. Furthermore, other types of single mode radiotelephone receivers such as CDMA, CDMA 2000, WCDMA, GSM, PDC cellular radiotelephone receivers, TDMA, E-TDMA receivers, receivers for receiving amplitude modulated (AM) and phase modulated signals and the like, are also intended to be within the scope of the present invention.

Turning first to FIG. 1, a multi-mode receiver 100 in accordance with an embodiment of the invention is shown Multi-mode receiver 100 may receive signals of two or more communication systems. Multi-mode receiver 100 may receive signals from GSM, PDC, CDMA, CDMA 2000, WCDMA, TDMA, E-TDMA, analog radiotelephone systems and the like. For the simplicity, the multi-mode receiver 100 will be described as dual-mode GSM/WCDMA direct conversion receiver. However, it should be understood that the scope and application of the present invention is in no way limited to this example; other receiving methods and/or receivers architecture may be included within the scope of the present invention. Multi-mode receiver 100 may include a Radio Frequency (RF) mixer 10, a baseband module 20 and a demodulator 30. The baseband module 20 may include an in-phase (I) channel 40, a quadrature (Q) channel 50, a timing unit 55, a memory 60, delay buffers 65 and digital to analog converters (DACs) 70. For simplicity, in this example I channel and Q channel may have a substantially equal structure and the description of I channel 40 may also include the description of Q channel 50. A controller 90 may control the operation of RF mixer 10, baseband module 20 and demodulator 30.

In operation, a received signal 75 may be inputted to RF mixer 10. Although the scope of the present invention is not limited to this example, received signal 75 may be a GSM signal or a WCDMA signal. However, in alternative embodiments of the present invention the received signal 75 may be a signal of other wireless communication systems such TDMA, PDC, CDMA, CDMA2000 or the like. RF mixer 10 may down convert the received signal 75 to I and Q analog baseband signals, In addition, information on the type of the received signal 75, e.g. GSM or CDMA, may be provided to controller 90. I and Q analog baseband signals may be inputted to I channel 40 and to Q channel 50, respectively. I channel 40 and Q channel 50 may include programmable filters, wherein switching between modes is done by programming the filters according to the characteristics of the received signal 75. However, it should be understood that the received signal 75 may be an example of a modulated signal and characteristics of the received signal 75 may be the characteristics of the modulated signal. In this example, the characteristics of the received signal 75 may include frequency, amplitude and phase. Furthermore, the received signal 75 may include data on the wireless communication system type, for example GSM, WCDMA or the like. Timing unit 55, memory 60, delay buffers 65 and DACs 70 may be used to program the programmable filters of I channel 40 and Q channel 50. Memory 60 may be for example, a read only memory (ROM), programmable read only memory (PROM), erasable programmable read only memory (EPROM), FLASH memory read access memory (RAM) dynamic read access memory (DRAM) and the like. Memory 60 may store for example, impulse responses to be programmed into programmable filters of I channel 40 and Q channel 50 when switching between receiving modes. Programming the programmable filter may be done, for example, by writing an address of a desired impulse response to memory 60 and providing impulse response data to the programmable filter. For example, an impulse response for a low pass filter may be programmed into programmable filters of I channel 40 and Q channel 50 when the received signal 75 is a GSM signal, and an impulse response for a band pass filter may be programmed into programmable filters of I channel 40 and Q channel 50 when the received signal 75 is a WCDMA signal.

Figure 2:
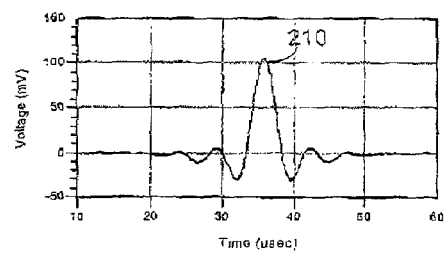
FIG. 2 is a schematic representation of an impulse response of a filter which may be used in accordance with the present invention.

An example of an impulse response 200 which may be programmed when the received signal is a GSM signal is shown in FIG. 2. Although the scope of the present invention is not limited in this respect, memory 60 may store a digital representation of the impulse response 200 (FIG. 2). For example, a digital representation of the impulse response may include digital samples of the impulse response signal and/or coefficients of the impulse response and the like. Timing unit 55 may provide a clock to output digital representation data of the impulse response 200 from ROM 60 through delay buffers 65 to the DACs 70. The number of delay buffers 65 may be substantially equal to the number of the DACs 70. The number of the DACs 70 may be set according to the length of the impulse response 200 and the sampling rate at the outputs of I channel 40 and Q channel 50. For example, for an impulse response length of ten times the symbol length and an output sampling rate of two samples per symbol, twenty DACs 70 may be used. Furthermore, the sampling rate and the resolution of DACs 70 may be adjustable. However, in alternative embodiments of the present invention, different numbers of delay buffers and DACs may be used. Furthermore, the number of DACs may not be dependent on the length of the impulse response 200. The DACs 70 may convert digital samples of the impulse response 200 into analog samples of analog signals. The analog signals may be provided with different time phases of the impulse response 200 to the programmable filters of I channel 40 and Q channel 50. A detailed description of I channel 40 and Q channel 50 will be given below with reference to FIG. 3. I channel 40 and Q channel 50 may output filtered I and Q analog signals 85 and 80, respectively. Filtered I and Q signals 85, 80 may be inputted to demodulator 30. Demodulator 30 may demodulate the filtered I and Q signals 85, 80 to provide voice and data to a subscriber of a radiotelephone system, if desired.

Figure 3:
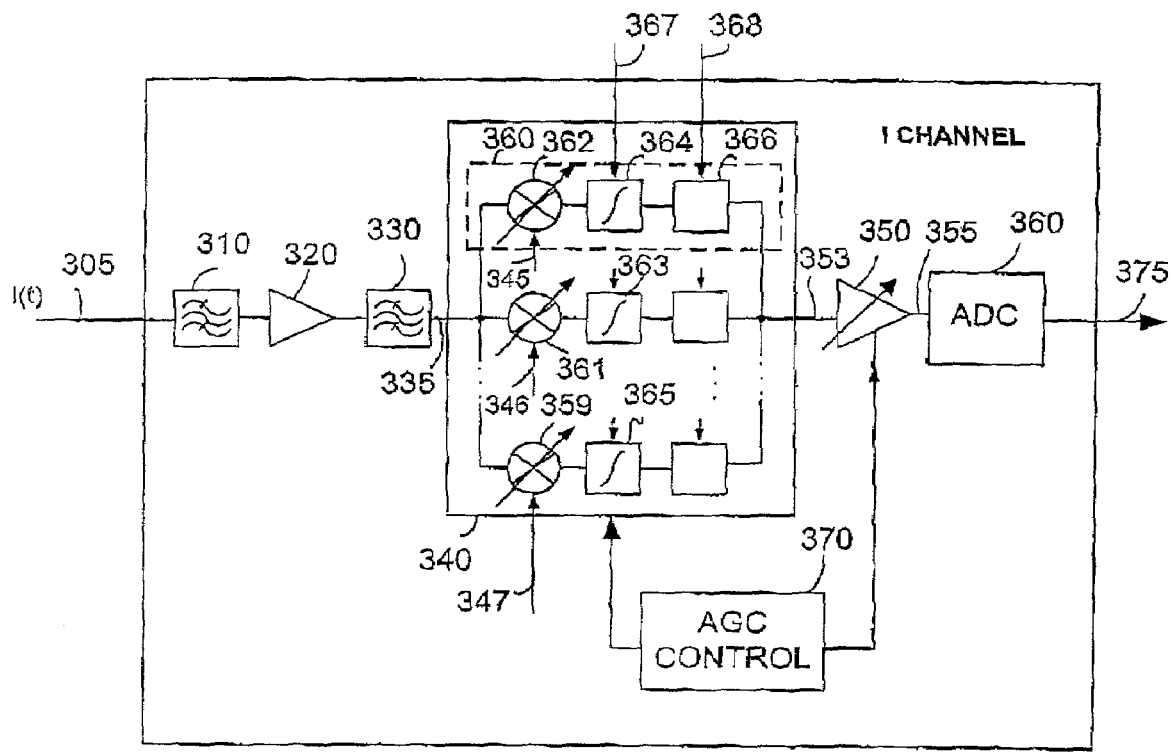
FIG. 3 is a schematic representation of an In-Phase (I) channel or a quadrature channel (Q) of a baseband module of the multi-mode receiver of FIG. 1.

Turning to FIG. 3 a block diagram of I channel 40 or Q channel 50 is shown. Although the scope of the present invention is not limited in this respect, I channel 40 and Q channel 50 may have similar architecture. For simplicity, the description may refer to I channel 40, if desired. I channel 40 may comprise baseband filters. Baseband filters may include one or more predefined filters and one or more programmable filters.

Although the scope of the present invention is in no way limited in this respect, the programmable filters may be filters whose type and other characteristics, such as, for example, a frequency response, may be programmed by setting the numbers of poles by software or by hardware, if desired. An example of a programmable filter may be, a switch capacitors filter, a finite impulse response (FIR) filter, a programmable convolver and the like.

Although the scope of the present invention is no limited in this respect, I channel 40 may include a pre-filter 310 having a programmable number of poles, a buffer 320, an anti-aliasing filter 330 having a programmable number of poles, a programmable convolver 340, an amplifier 350, an analog to digital converter (ADC) 360 and an automatic gain control (AGC) loop 370.

In operation, the modulated signal 305 may be an In-Phase (I) portion of the received signal 75. However, the present invention is in no way limited in this respect and the modulated signal 305 may be the Quadrature (Q) portion of the received signal 75 or tie received signal 75 itself. Modulated signal 305 may be inputted to pre-filter 310. Pre-filter 310 may be a single pole low pass filter. Buffer 320 may protect output signal of the pre-filter 310 from distortion. Pre-filter 310 may filter the modulated signal 305 to limit third order intercept point (IP3). Anti-aliasing filter 330 may be used to filter alias frequencies that are at multiples of DACs 70 rate from the modulated signal 305 and to filter interference signals of modulated signal 305.

Programmable convolver 340 may be programmed to be a low pass filter to reject first and second adjacent channel interference from the modulated signal 305. The programming of the programmable convolver 340 may be done by providing time phases of an impulse response signal. For example, impulse response 200 may be duplicated with a time phase shift from the origin impulse response and may be duplicated with a time phase shift from a previous duplicated signal. Although the scope of the present invention is not limited in this respect, duplication of the impulse response with a time phase shift from a previous duplicated signal may proceed until the desired number of impulse response time phases will be provided to the programmable convolver 340. The type of programmed filter may be determined according to the characteristic of the modulated signal 305 and may be generated by the shape of the impulse response 200. A detailed description of the operation of the programmable convolver 340 and the switching method between receiving modes will be described below.

Although the scope of the present invention is not limited in this respect, AGC control 370 may control the amplitude of the programmable convolver 340 output signal 353 by adjusting the gain of amplifier 350. Amplifier 350 may provide a filtered modulated signal 355 that has an average amplitude level to ADC 360. In addition, AGC control 370 may control the amplitude level of programmable convolver 340 integrators 363, 364, 365 to prevent saturation of signals that are processed by the programmable convolver 340. ADC 360 may convert filtered modulated signal 355 into digital signal 375. In an alternative embodiment of I channel 40, a reconstruction filter (not shown) may be coupled to the output of amplifier 350 to reconstruct the digital signal 375 to an analog signal. Although the scope of the present invention is not limited in this respect, analog signal or digital signal 375 may be provided to the demodulator 30.

Although the scope of the present invention is not limited in this respect, the programmable convolver 340 may include branches. Number of the branches may be determined according to the length of the impulse response 200. In the example described above, the length of the impulse response 200 may be ten times the symbol length. Thus, the programmable convolver 340 may include twenty branches. For example, branch 360 may include a multiplier 362, an integrator 364 and a switch 366.

Although the scope of the present invention is not limited in this respect, multipliers 359, 361, 362 may receive filtered modulated signal 355 and time phases of impulse response signal 345, 346, 347 from DACs 70. For example, multiplier 362 may receive pre-filtered signal 335 and a time phase of inversed impulse response signal 345. Multiplier 362 may multiply prefiltered signal 335 with the time phase of inversed impulse response signal 345. Integrator 364 may accumulate the multiplication signal according to clock 367. For example, clock 367 may be provided by timing unit 55. Sample switch 366 may provide samples of the integrated signal from integrator 364 to amplifier 350. The samples may be connected and released according to clock 368 of timing unit 55. Although the scope of the present invention is not limited in this respect, the operation described above may be done in parallel at the branches of the programmable convolver 340. Different time phases of the impulse response signal, for example impulse response 200, may be provided to the branches, respectively. For example, time phases of impulse response signal 345, 346, 347 may be provided to multipliers 362, 361, 359, respectively. Amplifier 350 may combine samples that are provided by the branches and may provide filtered modulated signal 355 to ADC 360. The gain of amplifier 350 may be controlled by AGC control 370. Furthermore, AGC control 370 may control the signal level that is inputted to integrators 363, 364, 365 by adjusting the gain of multipliers 359, 361, 362. Adjusting the gain of multipliers 359, 361, 362 may have an effect on peak level 210 of impulse response 200. ADC 360 may convert filtered modulated signal 355 into digital signal 375. Although the scope of the present invention is not limited in this respect, in an alternative embodiment of the present invention, the peak level 210 of impulse response 220 may be modified, for example, by a digital signal processor by multiplying the impulse response by half (0.5).

Although the scope of the present invention is not limited in this respect, in an alternative embodiment of the present invention, pre-filter 310 and anti-aliasing filter 330 may be programmable convolvers, for example programmable convolvers with analog output. The programmable convolver may be the same or similar to the programmable convolver 340. Furthermore, buffers may be used to buffer the output of the convolvers. In an alternative embodiment of the present invention, a reconstruction filter may be used to buffer the output of pre-filter 310 and anti-aliasing filter 330. In addition, the gain of the buffer may be adjusted by AGC control (not shown).

Figure 4:
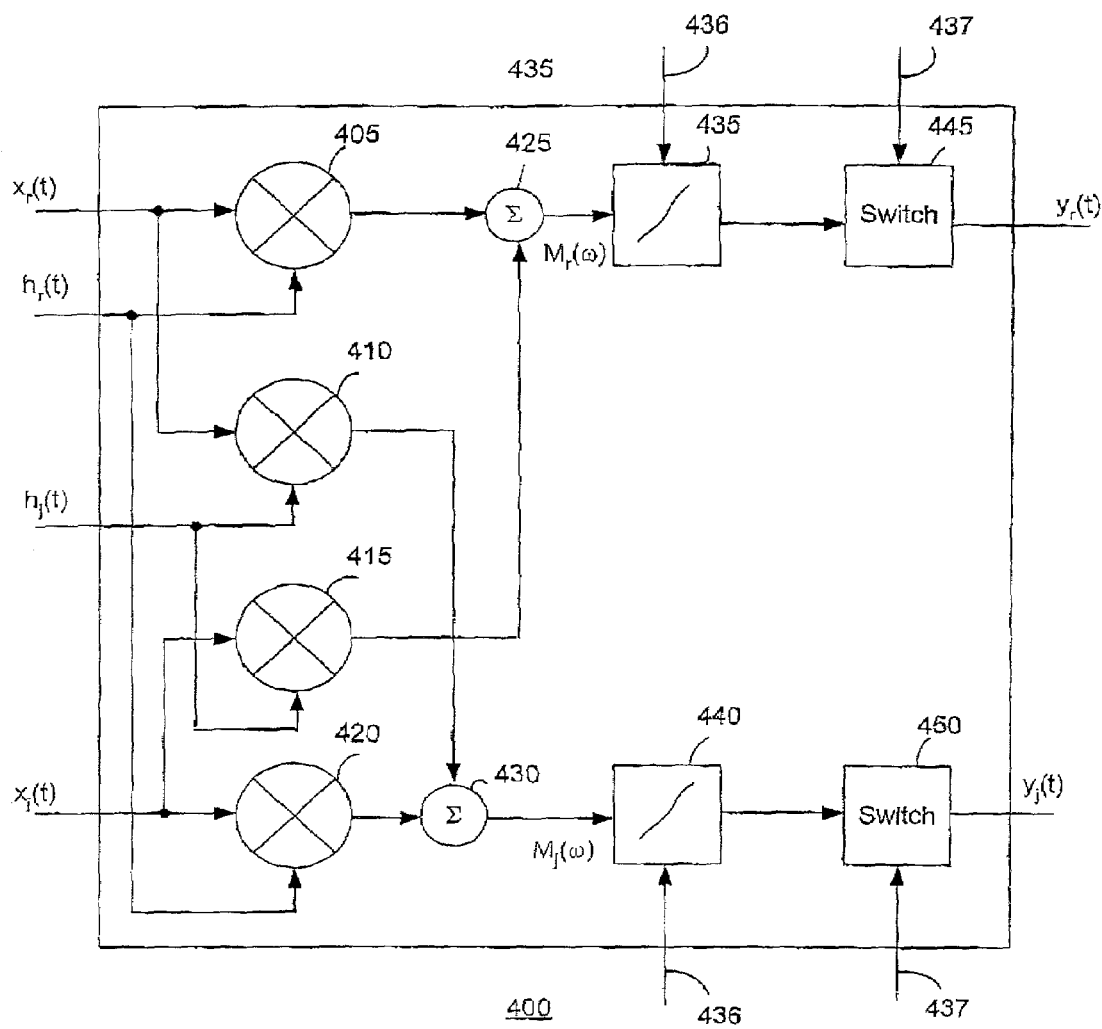
FIG. 4 is a schematic representation of a branch of a complex programmable convolver according to an embodiment of the invention.

Although the scope of the present invention is not limited in this respect, in alternative embodiments of the present invention the programmable convolver 340 may be a complex programmable convolver. An example of a branch of a complex programmable convolver 400 will be described now with reference to FIG. 4.

Although the scope of the present invention is not limited in this respect, a complex programmable convolver (not shown) may include branches according to the length of the impulse response 200, for example, twenty branches. Branch 400 may include real multipliers 405, 410, 415, 420, adders 425, 430, integrators 435, 440 and sample switches 445, 450.

In operation, I signal or Q signal x(t) may be split into two signals $x_r(t)$ and $x_j(t)$ wherein $x_r(t)$ is the real part of x(t) and $x_j(t)$ is the imaginary part of x(t). $x_r(t)$ may be inputted to multipliers 405 and 410. $x_j(t)$ may be inputted to multipliers 415 and 420. A time phase of inversed impulse response h(t) may be split to two signals $h_r(t)$ and $h_j(t)$ wherein $h_r(t)$ is the real part of the impulse response h(t) and $h_j(t)$ is the imaginary part of h(t). $h_r(t)$ may be inputted to multipliers 405 and 420 and $h_j(t)$ may be inputted to multipliers 410 and 415. Outputs of multipliers 405 and 415 may be inputted to adder 425 and outputs of multipliers 410 and 420 may be inputted to adder 430. Adder 425 may generate a real multiplication product $M_r(\omega)$ and adder 430 may generate an imaginary multiplication product $M_j(\omega)$. Thus, the frequency domain representation of the complex terms of the multiplication signals may be $$M_r(\omega)=X_r(\omega)H_r(\omega)-X_j(\omega)H_j(\omega)$$

$$M_j(\omega)=X_r(\omega)H_j(\omega)+X_j(\omega)H_r(\omega).$$

$M_r(\omega)$ may be inputted to integrator 435. Integrator 435 may accumulate real multiplication products $M_r(\omega)$ according to clock 436 of, for example, timing unit 55 of FIG. 1. Sample switch 445 may output samples of real multiplication products $M_r(\omega)$ according to clock 437 of, for example, timing unit 55 of FIG. 1. $M_j(\omega)$ may be inputted to integrator 440. Integrator 440 may accumulate real multiplication products $M_j(\omega)$ according to clock 436 of, for example, timing unit 55 of FIG. 1. Sample switch 450 may output samples of real multiplication products $M_r(\omega)$ according to clock 437 of, for example, timing unit 55 of FIG. 1 Although the scope of the present invention is not limited in this respect, branch 400 may output a split filtered signal $y_r(t)$ and $y_j(t)$. Outputs of the programmable complex convolver may comprise a combination of $y_r(t)$ signals from the branches and a combination of $y_j(t)$ signals from the branches. Although the scope of the present invention is not limited in this respect, in an alternative embodiment of the present invention that may comprise a complex programmable convolver, outputs $y_r(t)$ and $y_j(t)$ may be combined into one signal.

Figure 5:
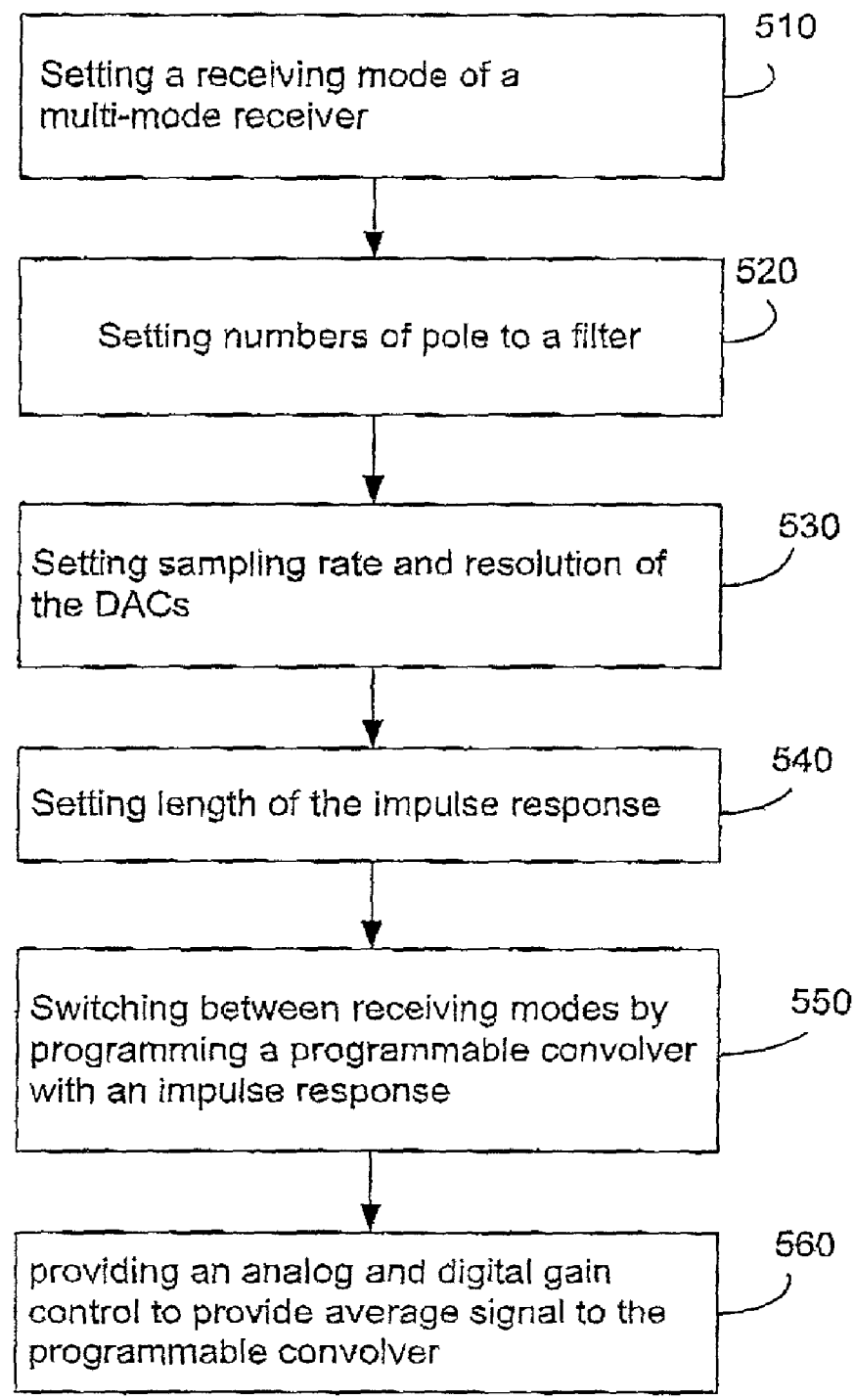
FIG. 5 is a flow chart of a method in accordance with an embodiment the present invention.

Turning to FIG. 5, a flow chart of a method in accordance with an embodiment of the present invention will be described below. Although the scope of the present invention is not limited to this example, multi-mode receiver may receive an indication on the receiving mode of receiver 100 from controller 90, block 510. For example, dual-mode GSM/WCDMA receiver 100 of FIG. 1 may receive an indication that receiving signal 75 is a GSM signal. In response, the frequency response of filters 310 and 320 of FIG. 3 may be set by modifying the structure of filters 310 and 320 and by setting the number of poles of filters 310, 320 to two poles (block 520). The sampling rate of DACs 360 may be set to twenty samples per symbol time (block 530). The resolution of the DACs 70 may be set to five bits (block 530) and the length of the impulse response 200 may be set to ten times the symbol length (block 540). Baseband module 100 may be switched to GSM mode by programming the programmable convolver 340 with, for example, an impulse response of a low pass filter (block 550). For receiving signal 75 of WCDMA signal, the frequency response of pre-filter 310 and anti-aliasing filter 330 may be programmed to have a different structure from GSM filters and the number of poles may be set to three poles (block 520). The sampling rate of DACs 70 may be set to twenty samples per symbol time (block 530). The resolution of DACs 70 may be set to five bits (block 530) and the length of the impulse response 200 may be set to ten times the symbol length (block 540). Baseband module 100 may be switched to WCDMA mode by programming the programmable convolver 340 with, for example, an impulse response of a band pass filter (block 550). AGC control 370 may provide an analog and digital gain control that may control the signal level inputted to the programmable convolver 340 to be at an average level, block 560. Although the scope of the present invention is not limited in this respect, in an alternative embodiment of the present invention the programmable baseband module 40 may include a complex programmable convolver.

While certain features of the invention have been illustrated and described herein, many modifications, substitutions, changes, and equivalents will now occur to those skilled in the art. For example, the use of an adaptive function for varying a phase and amplitude of an output signal may be used in many devices other then transmitters. It is, therefore, to be understood that the appended claims are intended to cover all such modifications and chances as fall within the true spirit of the invention.

What is claimed is:

1. An apparatus comprising:
   a first filter having a programmable number of poles operably coupled to an input of a buffer;
   a second filter having a programmable number of poles operably coupled to an output of the buffer; and
   a programmable convolver operably coupled to an output of the second filter and wherein the programmable convolver is able to filter a received signal of a wireless communication system by programming an impulse response based on a characteristic of the received signal.

2. The apparatus of claim 1 comprising:
   a memory to store the impulse response; and
   a digital to analog converter (DAC) to provide a time phase of a stored impulse response to the programmable convolver.

3. The apparatus of claim 2, comprising:
   an automatic gain control to control an output signal level of the programmable convolver.

4. The apparatus of claim 2, wherein a resolution of the digital to analog converter and a sampling rate of the digital to analog converter are set according to the received signal characteristic.

5. The apparatus of claim 1, wherein a length of the impulse response is set according the received signal characteristic.

6. The apparatus of claim 1, further comprising:
   an amplifier operably coupled to an output of the programmable convolver; and
   a second digital to analog converter operably coupled to the output of the amplifier.

7. The apparatus of claim 2, wherein the memory comprises two or more impulse responses, and the programmable convolver is programmed with the impulse response selected from the two or more impulse responses according to the characteristic of the received signal.

8. The apparatus of claim 1, wherein the programmable convolver is a complex programmable convolver.

9. The apparatus of claim 1, wherein the programmable convolver includes an analog output.

10. An apparatus comprising:
    a receiver able to receive signals from two or more wireless communication systems having a baseband module, wherein the baseband module includes an in-phase (I) channel to filter an I signal of the received signal and a quadrature (Q) channel to filter a Q signal of the received signal and wherein both I and Q channels include a first filter having a programmable frequency response, operably coupled to an input of a buffer; and a second filter having a programmable frequency response, operably coupled to an output of the buffer and to an input of a programmable convolver.

11. The apparatus of claim 10 comprising:
    a memory to store the first programmable impulse response and the second programmable impulse response to program the first and second filters, respectively.

12. The apparatus of claim 10, wherein both I and Q channels comprise:
    digital to analog converters (DACs) operably coupled to the programmable convolver, wherein the DACs comprise an adjustable sampling rate and an adjustable resolution.

13. The apparatus of claim 10, wherein both I and Q channels comprise:
    an automatic gain control operably coupled to the programmable convolver to control a signal level of the programmable convolver and to provide an average amplitude level at the programmable convolver output.

14. The apparatus of claim 10, wherein the receiver is a direct conversation multi-mode receiver.

15. The apparatus of claim 10, wherein the I channel and the Q channel comprise programmable complex convolvers.

16. The apparatus of claim 10, wherein the first filter and the second filter are programmable convolvers.

17. A method of selecting a mode of a multi-mode receiver comprising:
    receiving a signal;
    programming a first programmable frequency response to a first filter according to a characteristic of the received signal and filtering the received signal to provide a first filtered signal;
    buffering the first filtered signal to provide a buffered signal
    programming a second programmable frequency response to a second filter according to a characteristic of the received signal and filtering the buffered signal to provide a second filtered signal; and
    programming a programmable convolver with an impulse response of a filter based on the characteristic of the received signal and filtering the second filtered signal.

18. The method of claim 17, further comprising:
    setting the first and second programmable frequency response by setting first and second number of poles to the first and second filters, respectively.

19. The method of claim 17, further comprising:
    setting a sampling rate and a resolution to a digital to analog converter to switch between receiving modes of the multi-mode receiver.

20. The method of claim 19, further comprising:
    setting a length of the impulse response according to the characteristic of the received signal characteristic.

21. The method of claim 20, further comprising:
    providing a combined analog and digital gain control to control a signal level of the programmable convolver.

* * * * *